(12) United States Patent
Bishop et al.

(10) Patent No.: US 11,238,360 B2
(45) Date of Patent: Feb. 1, 2022

(54) FAST QUANTUM FEEDBACK USING ANALOG INTEGRATION AND CONTROL PULSE GATING

(71) Applicant: International Business Machines Corporation, Armonk, NY (US)

(72) Inventors: Lev Samuel Bishop, Dobbs Ferry, NY (US); Jay M. Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1024 days.

(21) Appl. No.: 15/894,358

(22) Filed: Feb. 12, 2018

(65) Prior Publication Data

US 2019/0251478 A1    Aug. 15, 2019

(51) Int. Cl.
*G06N 10/00* (2019.01)
*H03K 3/38* (2006.01)
*G06F 17/16* (2006.01)
*G06G 7/00* (2006.01)
*G06F 7/16* (2006.01)

(52) U.S. Cl.
CPC ............... *G06N 10/00* (2019.01); *G06F 7/16* (2013.01); *G06F 17/16* (2013.01); *G06G 7/00* (2013.01); *H03K 3/38* (2013.01)

(58) Field of Classification Search
CPC . G06N 10/00; G06N 7/08; H03K 3/38; G06F 17/16; G06G 7/00
USPC ........ 395/396; 324/676, 71.1, 537; 375/224, 375/228; 706/22, 13, 45, 7; 257/14
See application file for complete search history.

(56) References Cited

U.S. PATENT DOCUMENTS

| 5,511,172 | A | 4/1996 | Kimura et al. |
| 5,526,499 | A | 6/1996 | Bernstein et al. |
| 7,911,265 | B2 | 3/2011 | Dzurak et al. |
| 7,982,646 | B2 | 7/2011 | Herr et al. |
| 8,416,109 | B2 | 4/2013 | Kirichenko |
| 9,818,064 | B1 * | 11/2017 | Abdo ................. G01R 29/0814 |

(Continued)

FOREIGN PATENT DOCUMENTS

| GB | 1 375 609 A | 11/1974 |
| WO | 2017031357 A1 | 2/2017 |
| WO | 2017139683 A1 | 8/2017 |

OTHER PUBLICATIONS

Fu, et al., "An Experimental Microarchitecture for a Superconducting Quantum Processor," arXiv:1708.07677v1 [quant-ph] Aug. 25, 2017, 13 pages.

(Continued)

*Primary Examiner* — Arnold M Kinkead
(74) *Attorney, Agent, or Firm* — Amin, Turocy & Watson, LLP

(57) ABSTRACT

The technology is generally directed towards a pulse generation component that outputs a control pulse with a timing delay. A qubit state decision component uses an analog kernel to perform a linear filtering operation on (e.g., multiplies and integrates) a qubit signal to obtain a result corresponding to a qubit state, and compares the result to a threshold value to determine a measurement outcome result corresponding to the qubit state. A conditional gate component conditionally gates the control pulse based on the measurement outcome result.

25 Claims, 11 Drawing Sheets

(56) References Cited

U.S. PATENT DOCUMENTS

| | | |
|---|---|---|
| 2002/0179937 A1 | 12/2002 | Ivano et al. |
| 2008/0185576 A1 | 8/2008 | Hollenberg et al. |
| 2017/0116159 A1 | 4/2017 | Hamze et al. |
| 2017/0286858 A1 | 10/2017 | La Cour et al. |
| 2017/0308803 A1 | 10/2017 | Wallman et al. |

OTHER PUBLICATIONS

Ristè, et al., "Digital Feedback in Superconducting Quantum Circuits," arXiv:1508.01385v1 [quant-ph] Aug. 6, 2015, 33 pages.
Ryan, et al., "Hardware for Dynamic Quantum Computing," arXiv:1704.08314v1 [quant-ph] Apr. 26, 2017, 13 pages.
Salathé, et al., "Low-Latency Digital Signal Processing for Feedback and Feedforward in Quantum Computing and Communication," arXiv:1709.01030v1 [quant-ph] Sep. 4, 2017, 20 pages.
International Search Report and Written Opinion received for PCT Application Serial No. PCT/EP2019/051332 dated May 28, 2019, 21 pages.

* cited by examiner

FAST QUANTUM FEEDBACK USING ANALOG INTEGRATION AND CONTROL PULSE GATING

BACKGROUND

The subject disclosure relates to quantum computing, and more specifically, to fast quantum feedback using analog integration and control pulse gating. Quantum computing employs quantum physics to encode information rather than binary digital techniques based on transistors. For example, a quantum computing device can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum computing device can employ qubits to encode information rather than binary digital techniques based on transistors. The way in which the qubit state is determined, which controls the generation of subsequent control pulses, is to digitize the analog signal from an experiment, whereby control hardware can determine the qubit state in digital domain. Because latency in quantum feedback is a significant factor with respect to error correction, much work has been done to minimize the latencies by optimal digital pipelining in field programmable gate arrays (FPGAs), using specialized analog-to-digital and digital-to-analog converters, and so on. Examples can be seen in "Low-Latency Digital Signal Processing for Feedback and Feedforward in Quantum Computing and Communication," Yves Salathe, et al. (2017); "Digital Feedback in Superconducting Quantum Circuits," Riste & DiCarlo (2015); "An Experimental Microarchitecture for a Superconducting Quantum Processor," Fu et al. (2017), "Hardware for Dynamic Quantum Computing," Colm Ryan et al. (2017), and others. As such, any improvement in reducing latency in quantum feedback is desirable.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products for fast quantum feedback using analog integration and control pulse gating are described.

According to an embodiment, a system can comprise a pulse generation component that outputs a control pulse with a timing delay. The system can further comprise a qubit state decision component that uses an analog kernel to perform a linear filtering operation on a qubit signal to obtain a result corresponding to a qubit state, and that compares the result to a threshold value to determine a measurement outcome result corresponding to the qubit state. The system can further comprise a conditional gate component that conditionally gates the control pulse based on the measurement outcome result. The qubit state decision component can comprise a microwave mixer component coupled to a capacitor integrator, and an analog comparator component that compares the result to the threshold value to determine the measurement outcome result. The qubit state decision component can be located in a cryostat proximate a qubit that provides the qubit signal. The system components, including those in in the analog domain, reduce latency.

According to another embodiment, a method is provided. The method can comprise generating a pulse that is received at an analog switch, and determining a qubit state, comprising multiplying a qubit signal by an analog kernel value to obtain a multiplication result, integrating the multiplication result into an integration result, and comparing the integration result to a threshold value to determine a measurement outcome result corresponding to the qubit state. The method can further comprise operating the analog switch to gate the pulse based on the measurement outcome result. The method can further comprise receiving, by the quantum computer, a second pulse at a second analog switch, and operating, by the quantum computer, the second analog switch to gate the second pulse based on the measurement outcome result or based on another measurement outcome result. The method performed at least in part in the analog domain reduces latency. According to yet another embodiment, a system can comprise pulse generation circuitry that generates a pulse to be received at an analog switch. The system can further comprise qubit state determination circuitry that determines a qubit state from an experiment, comprising to multiply a qubit signal by an analog kernel to obtain a multiplication result, integrate the multiplication result into an integration result, and compare the integration result to a threshold value to determine a measurement outcome result corresponding to the qubit state. The system can further comprise gate circuitry that gates the pulse at the analog switch based on the measurement outcome result. The analog switch can be a two-way analog switch having one speculative input corresponding to the pulse and another speculative input corresponding to another pulse, and wherein the gate circuitry gates the pulse based on the measurement outcome result by outputting the pulse instead of the other pulse. The system circuitry, including those in in the analog domain, reduce latency.

According to another embodiment, a method is provided. The method can comprise outputting a control pulse with a timing delay, and determining a measurement outcome result corresponding to a state of a qubit, comprising using an analog kernel to perform a linear filtering operation on a qubit signal to obtain a result corresponding to a qubit state, and comparing the result to a threshold value to determine a measurement outcome result corresponding to the qubit state. The method can further comprise conditionally gating the control pulse based on the measurement outcome result. The method performed at least in part in the analog domain reduces latency.

According to yet another embodiment, a system can comprise a pulse generation component that generates a pulse to be received at an analog switch. The system can further comprise a qubit state determination component that multiplies a qubit signal by an analog kernel to obtain a multiplication result, integrates the multiplication result into an integration result, and compares the integration result to a threshold value to determine a measurement outcome result corresponding to the qubit state. The system can further comprise a conditional gate component that gates the pulse at the analog switch based on the measurement outcome result. The system reduces latency.

DETAILED DESCRIPTION

Figure 1:
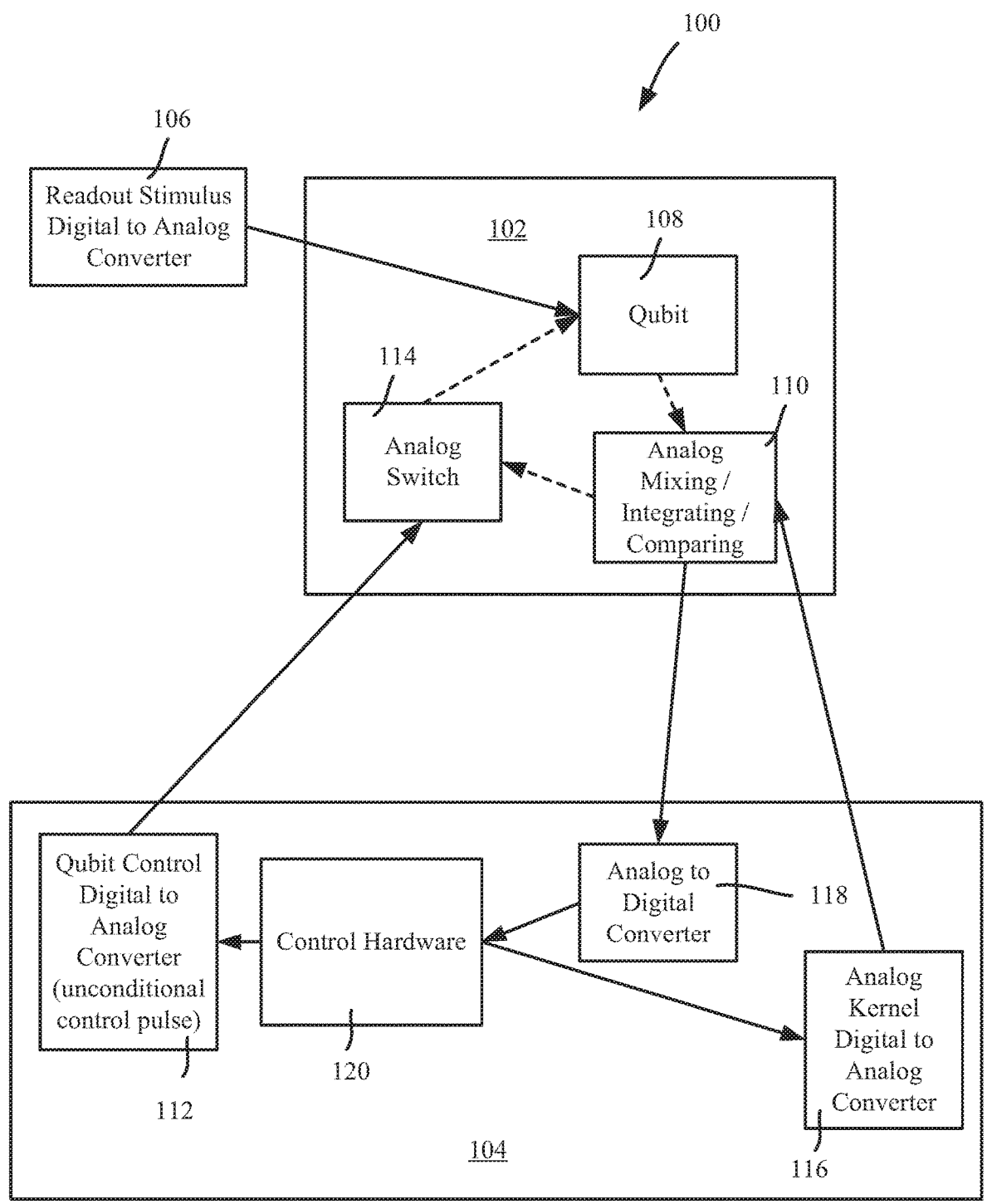
FIG. 1 illustrates a block diagram of an example, non-limiting system that includes analog decision and switching components in a pipeline configuration in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing employs quantum physics to encode information, in contrast to binary digital techniques based on transistors. For example, a quantum computer can employ quantum bits (e.g., qubits) that operate according to a superposition principle of quantum physics and an entanglement principle of quantum physics. The superposition principle of quantum physics states that each qubit can represent both a value of "1" and a value of "0" at the same time. The entanglement principle of quantum physics states that qubits in a superposition can be correlated with each other. For instance, a state of a first value (e.g., a value of "1" or a value of "0") can depend on a state of a second value. As such, a quantum computer can employ qubits to encode information.

A known property of quantum computing is that measuring the state of a qubit or subset of qubits in a quantum computing circuit changes the outcome of the circuit, relative to the outcome if not measured. As a result, measurement of qubits is generally an irreversible process.

A problem in quantum feedback is latency. A solution, described herein, is a technology to perform fast quantum feedback, e.g., active qubit reset, with relatively much lower latency than traditional methods. In general, a solution described herein is based on operating in the analog domain; rather than digitizing the analog signal that results from the experiment, the technology operates to generate a control (e.g., a "bit flip" or "x-pi") pulse and use an analog mixer and integrator close in proximity to the experiment to make the qubit state decision and gate the control pulse, e.g., via an analog switch. An advantage is that the analog-to-digital conversion, serialization and deserialization of the digital signal, and digital filtering, which add to latency, are avoided. To further reduce latency, if the analog circuitry is made cryogenically-compatible, it is feasible to locate the analog circuitry inside the cryostat to minimize speed-of-light delays. Otherwise the analog circuitry can be placed very near the cryostat, such as on top of it. In any event, the state decision is made in the analog domain as close to qubit as possible.

Embodiments described herein include systems, computer-implemented methods, and computer products for fast quantum feedback using analog integration and control pulse gating. Part of the technology can be implemented, for example, by using Quantum Assembly Language (QASM) software code.

FIG. 1 illustrates a block diagram of an example, non-limiting system 100 generally in the form of a quantum computing machine and other circuitry that among other operations acts as a pipeline, e.g., by having input pulses and the like timed with other operations. The system 100 can employ hardware and/or software to solve problems that are highly technical in nature, that are not abstract and that cannot be performed as a set of mental acts by a human. Further, in certain embodiments, some of the processes performed may be performed by one or more specialized computers (e.g., one or more specialized processing units, a specialized computer) for carrying out defined tasks related to machine learning. The system 100 and/or components of the system 100 can be employed to solve new problems that arise through advancements in technologies mentioned above, computer architecture, and/or the like. One or more embodiments of the system 100 can provide technical improvements to quantum circuit systems, quantum processor systems, quantum computing systems, artificial intelligence systems, medicine and materials systems, supply chain and logistics systems, financial services systems, and/or other systems. One or more embodiments of the system 100 can also provide technical improvements to a quantum processor (e.g., a superconducting quantum processor) by improving processing performance of the quantum processor, improving processing efficiency of the quantum processor, improving processing characteristics of the quantum processor, improving timing characteristics of the quantum processor and/or improving power efficiency of the quantum processor.

The example of FIG. 1 includes components 102 of a latency-significant feedback loop in which latency is minimized to the extent possible, and components 104 of a non-latency-critical feedback loop. Note that in FIG. 1, the dashed arrows represent an analog feedback loop where very low latency is desired, (getting the latency of the feedback loop as short as possible is desirable for many well-known reasons) while the solid arrows represent a non-latency-critical path (in which the higher latency can be basically hidden by controlled delay timing, that is, basically by pipelining) A readout stimulus (DAC) 106 is provided to the qubit 108, which produces analog signal waveform that represents an experiment outcome that is received at an analog mixing/integrating/comparing component 110.

As part of the pipelining, a qubit control DAC 112 unconditionally generates a control pulse, which is received at an analog switch 114; in this way, the control pulse is timed or "put into the pipeline." Note that the pipeline already pre-calibrated for fixed delays, and thus via an appropriate delay, the control pulses are put into correct timing slots in the pipeline.

Further, an analog kernel 116 with digital-to-analog converter operates to perform a linear filtering operation. To this end, in one embodiment the analog kernel 116 provides a value that is received and multiplied (e.g., as a dot product) by the analog mixing/integrating/comparing component 110 with the qubit signal. The multiplication result is integrated, with that result compared to a threshold value.

The result of the comparison corresponds to the measured qubit state, zero or one, and is used to control the analog switch. For example, if the control pulse is a qubit reset pulse and the integrated result exceeds the threshold value, the control pulse is gated through by the analog switch 114 which thereby resets the qubit state to zero. In one embodiment, if the qubit is measured to be in the "one" state the analog switch gates in a microwave reset pulse to get back to "zero" state. Otherwise the switch is gated (controlled) to prevent the reset pulse. In another possible alternative, two operations corresponding to pulses can be queued up in the pipeline, provided to a two-way analog switch, which is controlled by the measurement result to switch between either one (without any blanking). For example, there can be multiple in-pipeline control pulses corresponding to speculative execution of various branches, multi-way switching, and pulses can be pipelined across several conditional branches. Note that the measurement result can be used for other things, including to provide the result to the components 104 of the non-latency-critical feedback loop.

As represented by the dashed lines in FIG. 1, the analog feedback loop's latency is significantly lower than other (e.g., digital processing) techniques. In one or more embodiments, the analog decision component (of the analog mixing/integrating/comparing component 110) comprises a microwave mixer coupled to a capacitor integrator and analog comparator for thresholding.

FIG. 1 also shows a higher-latency feedback path that is used to update future pulses (control pulses, readout stimulus pulses, analog kernel pulses) at some delay down the pulse pipeline. The higher-latency feedback path, for example, includes an analog to digital converter 118 that converts the analog output of the analog mixing/integrating/comparing component 110 to a digital representation that is input into control hardware 120. Note that in FIG. 1, for example, there is sufficient time for a second decision to be made by the control hardware 120, e.g., if there are two decisions in sequence, the first decision is made in the analog domain; for example, to make two decisions in a row, the first decision can be made in the analog domain, and because the control hardware knows what first the decision result was, and if the latency in the slower loop is low enough, the second decision can be made in the digital domain. Note that the control hardware 120 in the slower decision path can be implemented in field programmable gate arrays.

Figure 2:
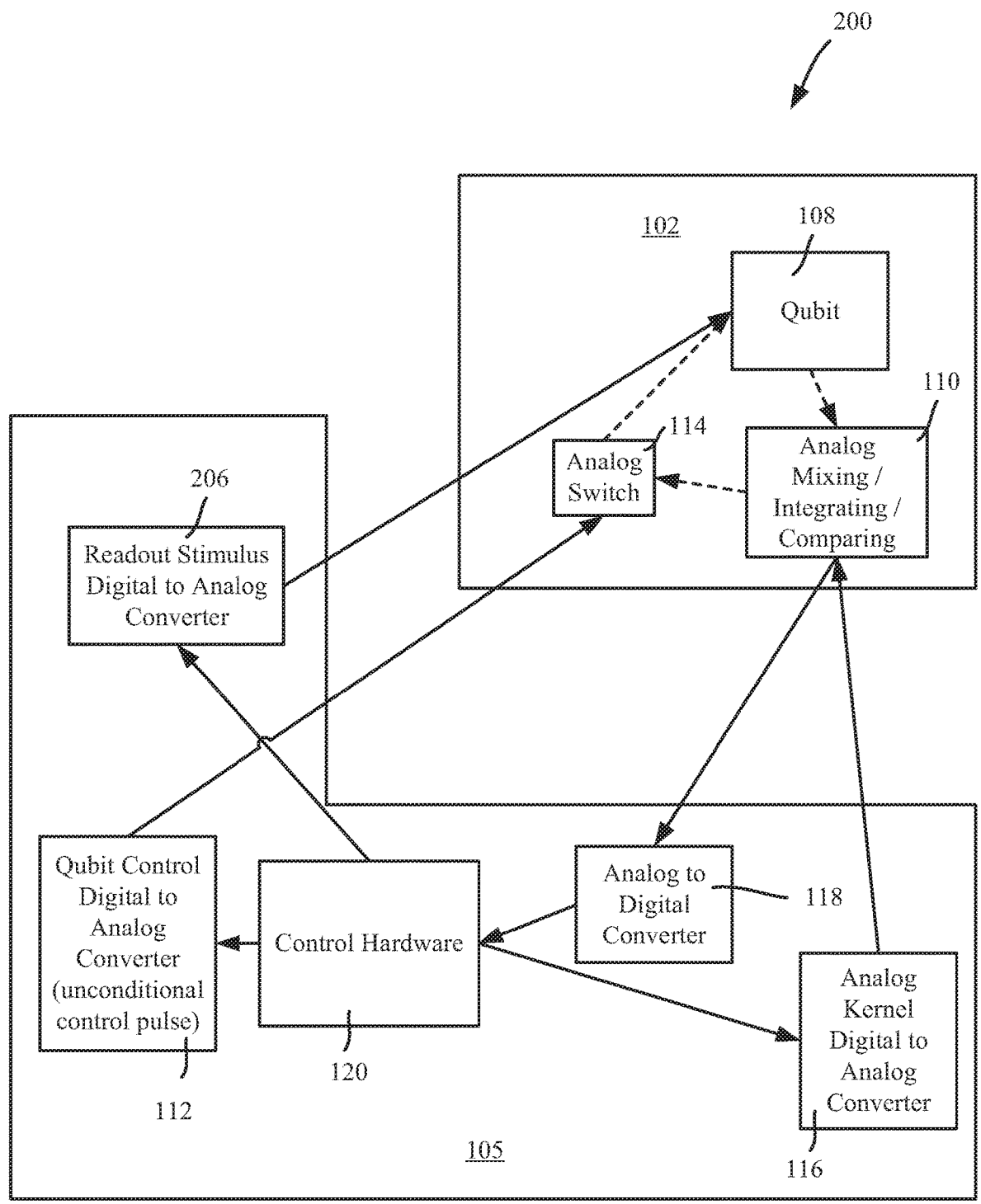
FIG. 2 illustrates a block diagram of an example, alternative non-limiting system that includes analog decision and switching components in a pipeline configuration in accordance with one or more embodiments described herein.

Note that FIG. 1 (as well as FIGS. 3 and 4, described below) illustrate the readout stimulus DAC 106 as being outside the slower, non-latency-critical feedback loop, e.g., the components 104 (FIG. 1), which can be the configuration for many possible embodiments in which the readout is unconditional even when the control pulses are conditional. Notwithstanding, FIG. 2 shows an alternative embodiment where the decision to perform a readout can be conditional, in which case the digital-to-analog converter 206 is part of a slower, non-latency-critical feedback loop 204. It should be understood that FIG. 2 shows only one example embodiment, and, for example, other embodiments in which the decision to perform the readout can be conditional, such as embodiments corresponding to FIG. 2 but otherwise generally similar to FIGS. 3 and 4 described below, as well as others, can be implemented.

Figure 3:
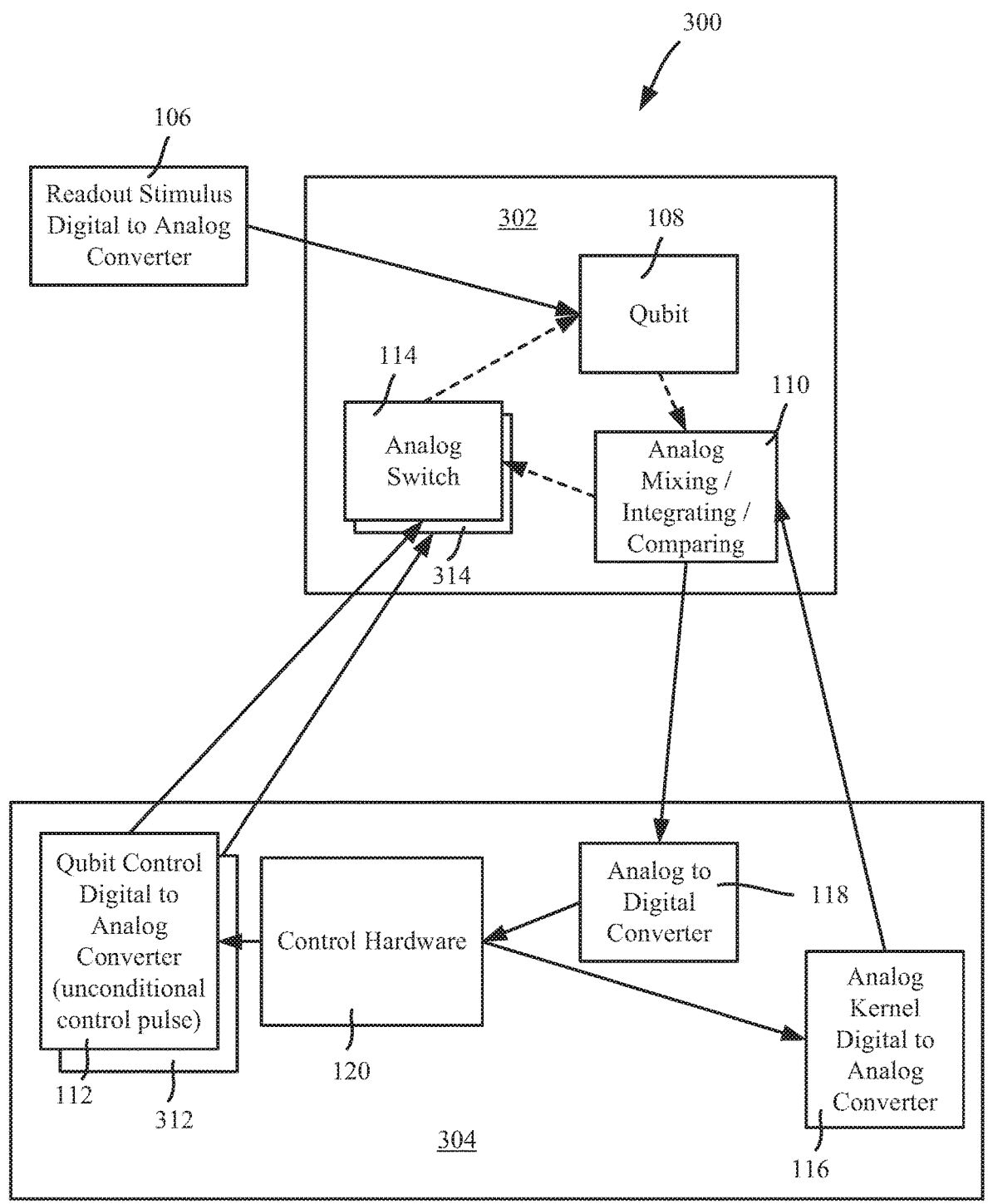
FIG. 3 illustrates a block diagram of an example, non-limiting system that includes two-level analog decision and switching components in a two-level pipeline configuration in accordance with one or more embodiments described herein.

FIG. 3 illustrates a block diagram of an alternative embodiment, in the form of an example, non-limiting system 300. In general, the components described above with reference to FIG. 1 operate in the same way as those in FIG. 3, and are not described again for purposes of brevity. However, consider that the slower loop's latency is too high; in addition to a first analog switch 114 that gates a first control pulse from the digital-to-analog converter 112, FIG. 3 shows a second analog switch 314 in the low latency components 302 that gates a second control pulse via a digital to analog converter 312 controlled by the control hardware 120 in the higher latency components 304. This provides a multilevel pipelining embodiment, in which two decisions can be made in the low latency, analog domain. As can be readily appreciated, although two such analog switch gates/pulses are shown in the exemplified embodiment of FIG. 3, alternative embodiments can be extended to any practical number of analog switch gates/pulses. For example, if there are four possible outcomes from two decisions, zero, one or two switch pulses can be gated based on which outcome occurred.

Figure 4:
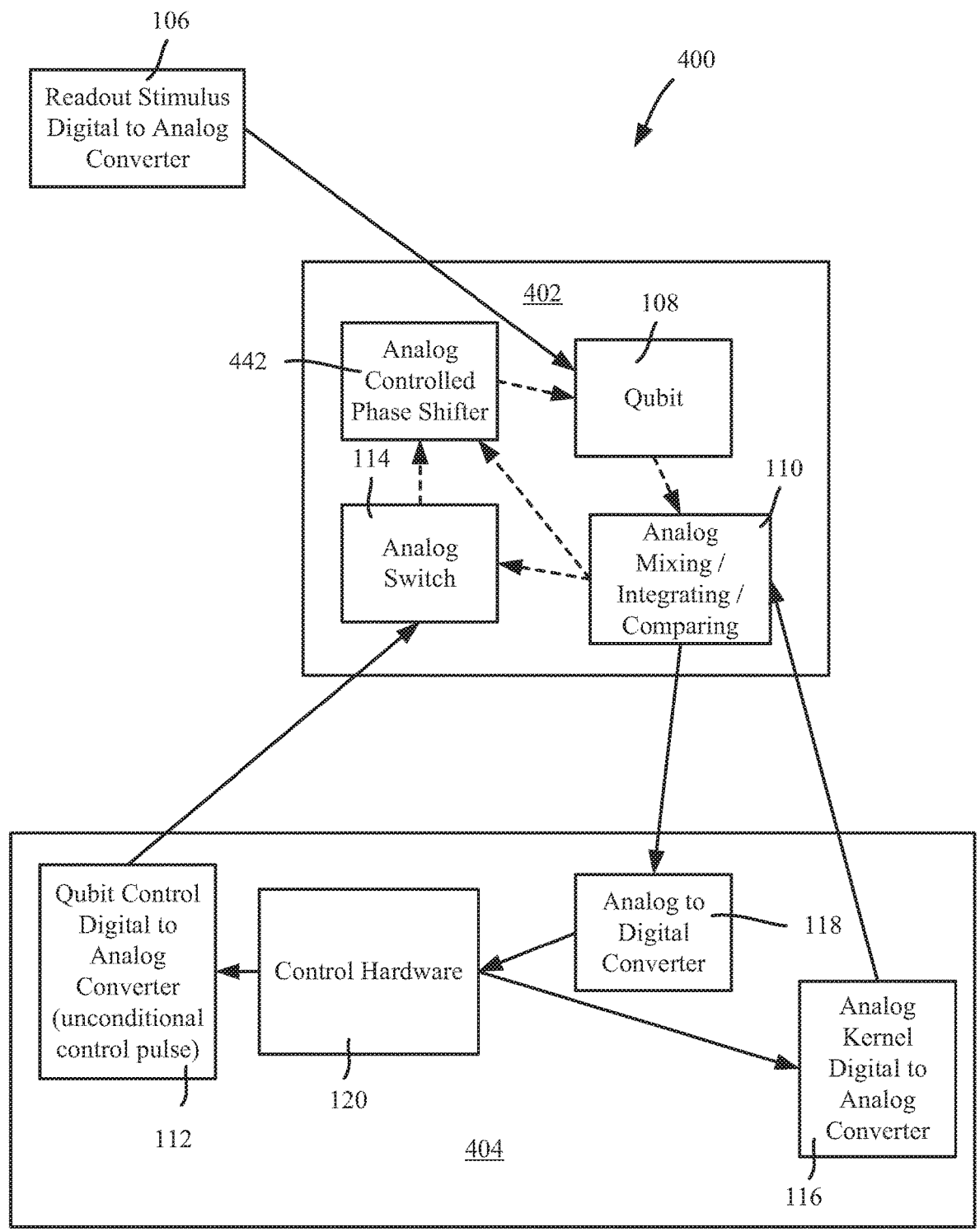
FIG. 4 illustrates a block diagram of an example, non-limiting system that includes analog decision and switching components, including a phase shifter, in accordance with one or more embodiments described herein.

FIG. 4 illustrates a block diagram of another alternative embodiment that includes analog phase shifting. In general, depending on whether the switch sends the pulse or not, following pulses need phase shift applied, that is, if the previous pulse is blanked, phase shift needs to be applied to subsequent pulses. Note that if the slow loop components are fast enough, the control hardware 120 can do the phase shifting. However, if the latency is too long in slow loop, the exemplified embodiment of FIG. 4 provides an analog phase shifter 442 to update the phase in the analog domain as needed, that is, with a control that is set based on the result of the measurement. Blank out previous pulse, shift needs to be applied to following pulses.

Figure 5:
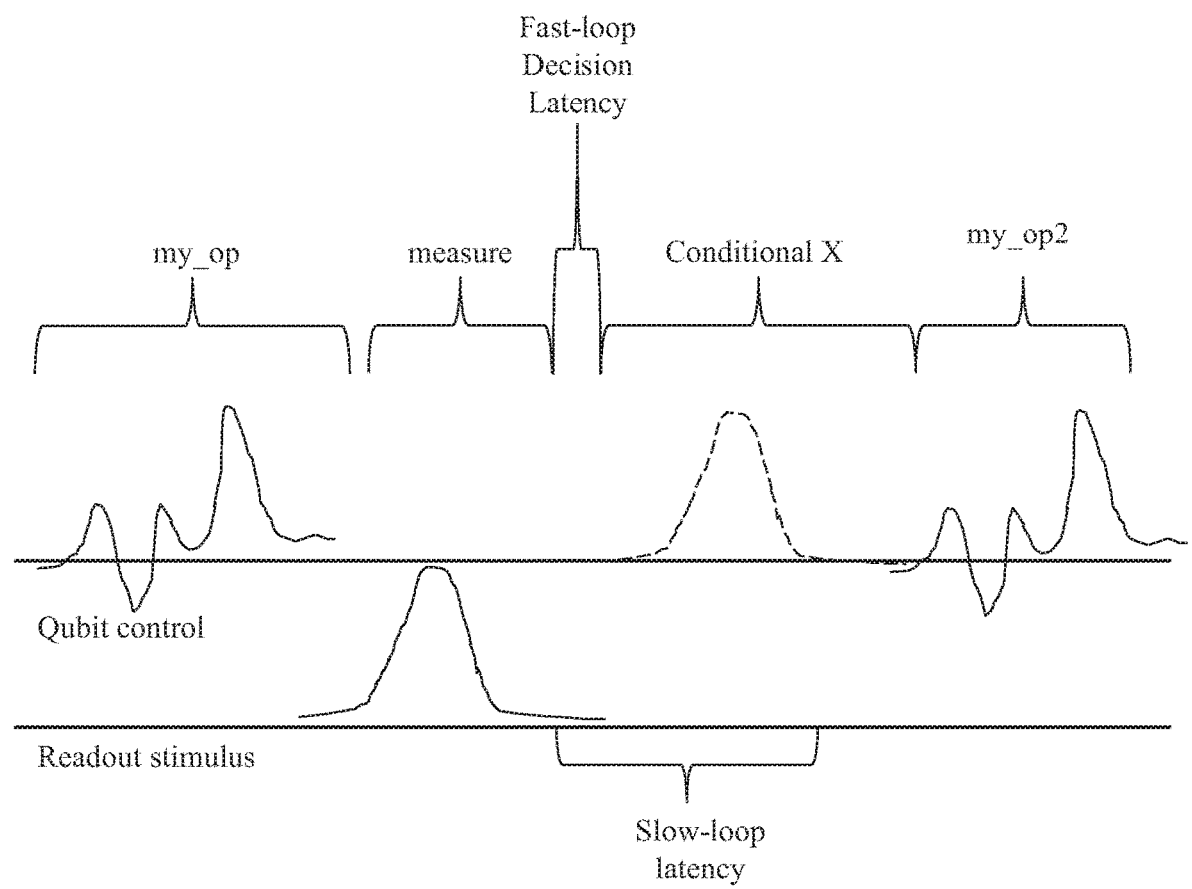
FIG. 5 illustrates a timing diagram of an example pulse sequence in a single-level pipeline, in accordance with one or more embodiments described herein.
Figure 6:
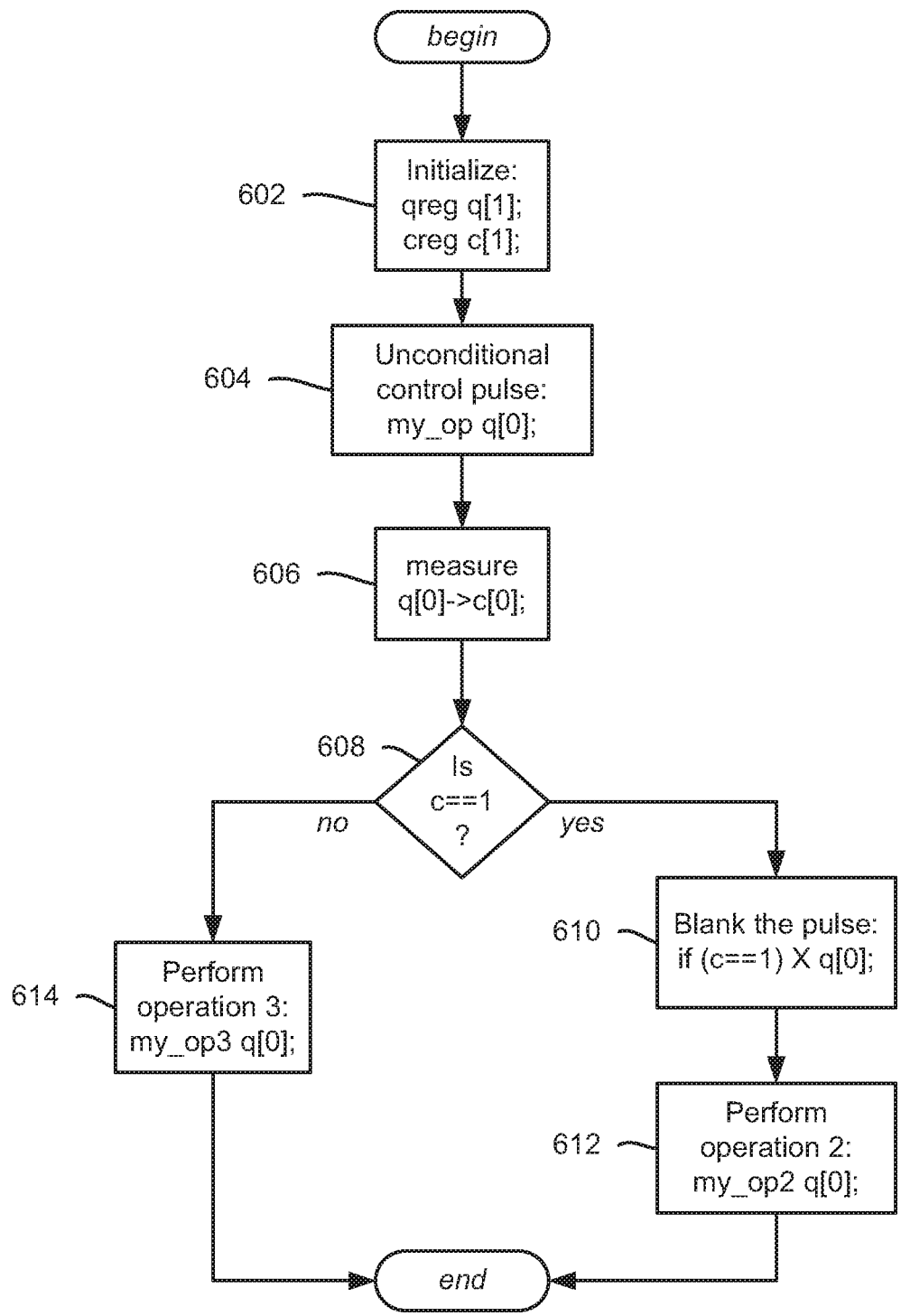
FIG. 6 is a flow diagram corresponding to code that when executed can produce pulse sequences (e.g., of FIG. 5), in accordance with one or more embodiments described herein.

FIG. 5 shows a timing diagram showing an example pulse sequence for a single level pipeline (e.g., as in FIG. 1). Note that the qubit control pulse is shown in FIG. 5 as dashed because it is conditional on the comparison result. In this example, the measurement outcome was "c==1" and thus the pulse was blanked and "my_op2 q[0]" is performed instead of "my_op3 q[0]." Further note that the slow loop latency is fast enough for choosing my_op2 via DAC rather than blanking The following QASM (e.g., OpenQASM 2.0) code shows the operations corresponding to the pulses; the operations are generally represented in FIG. 6. Note that operation 604 corresponds to the unconditional control pulse, operation 606 corresponds to the measurement, and operation 608 corresponds to the "if" evaluations. Operation 610 resets the qubit, as shown via the "X" in the code and in FIG. 6. As can be seen, the code specifies conditionals and maps well onto the if (<condition>)<operation> paradigm:

```
QASM:
qreg q[1]; // (FIG. 6, 602)
creg c[1]; // (FIG. 6, 602)
my_op q[0]; // (FIG. 6, 604)
measure q[0]->c[0]; // (FIG. 6, 606)
if (c==1) X q[0]; // (FIG. 6, 608, 610)
if (c==1) my_op2 q[0]; // (FIG. 6, 608, 612)
if (c==0) my_op3 q[0]; // (FIG. 6, 608, 614)
```

Figure 7:
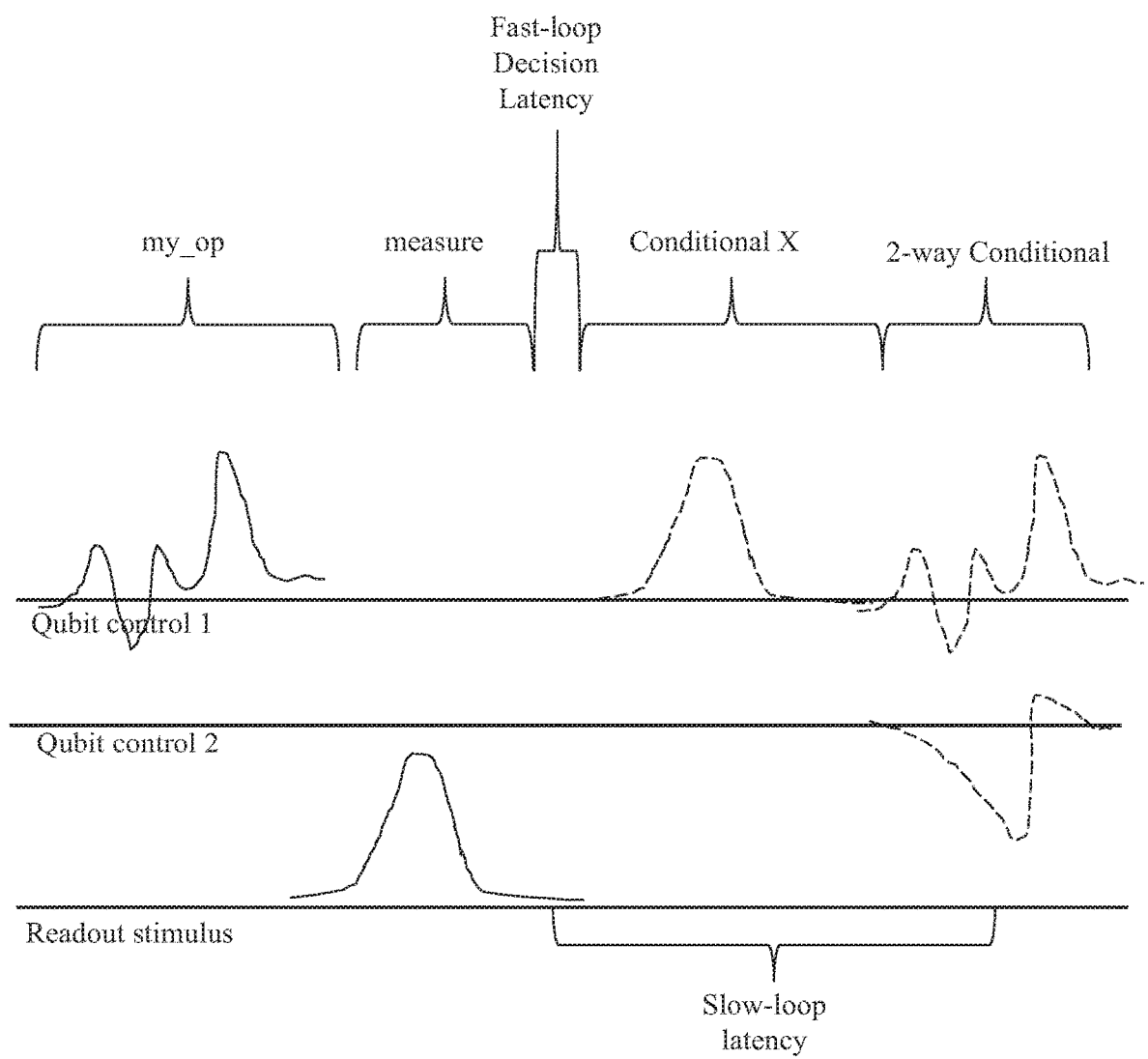
FIG. 7 illustrates a timing diagram of an example pulse sequence in a two-level pipeline, in accordance with one or more embodiments described herein.

FIG. 7 is a timing diagram illustrating an example pulse sequence in a two-level pipeline, using the same pseudocode as above. In this example embodiment, the latency of the slow loop is too lengthy, and thus a second analog switch and second qubit control pulse is used, e.g., as in FIG. 3.

As can be seen, there is described herein a technology for performing fast quantum feedback, e.g., active qubit reset, with much lower latency than traditional methods that operate mostly in the digital domain. The technology described herein non-deterministically generates control pulses and uses an analog mixer and integrator close to the experiment (possibly inside the cryostat) to make the qubit state decision and gate the control pulse.

Figure 8:
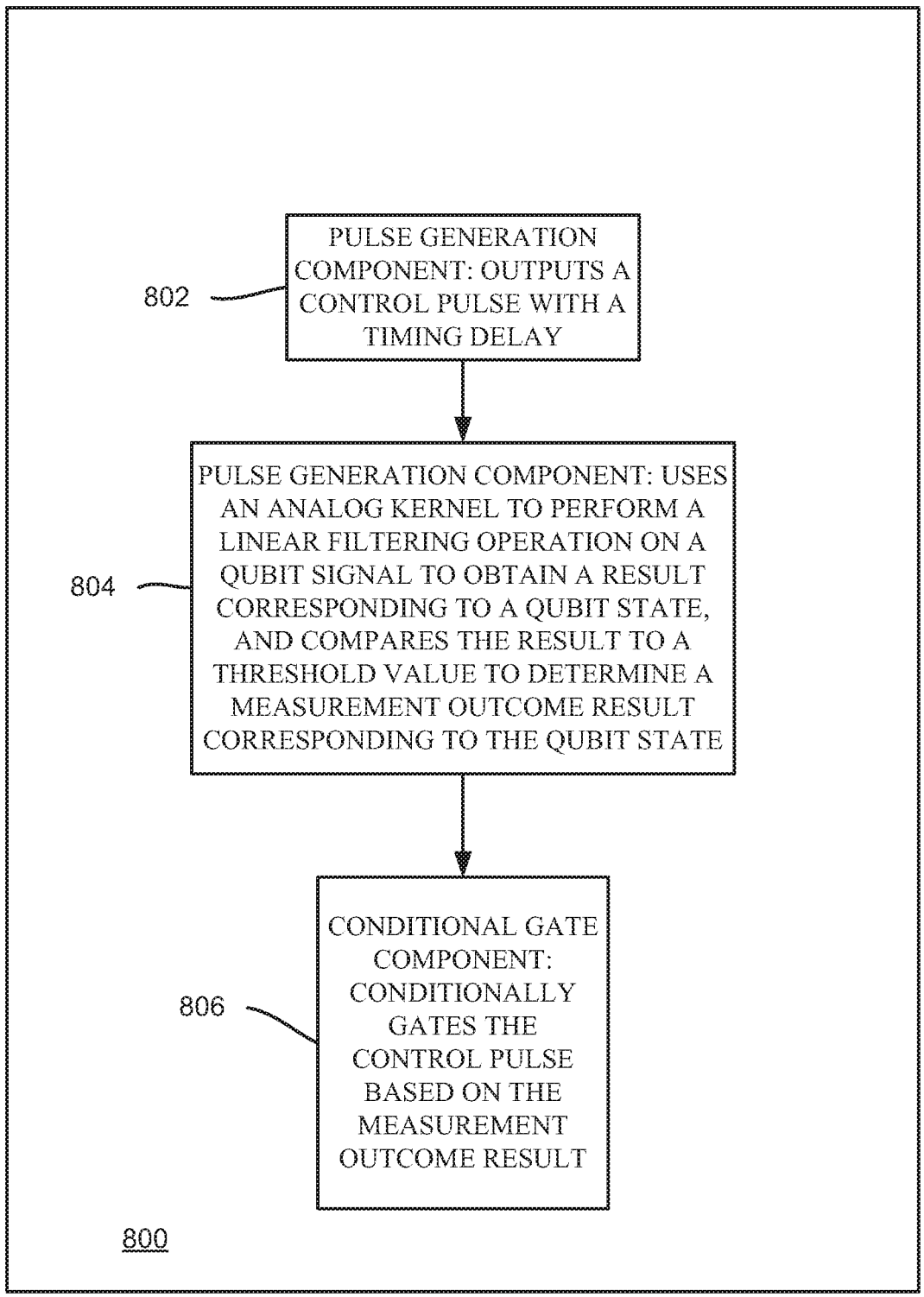
FIG. 8 illustrates a block diagram an example, non-limiting system in accordance with one or more embodiments described herein.

FIG. 8 represents a system 800, comprising a pulse generation component 802 that outputs a control pulse with a timing delay. A qubit state decision component 804 uses an analog kernel to perform a linear filtering operation on a qubit signal to obtain a result corresponding to a qubit state, and compares the result to a threshold value to determine a measurement outcome result corresponding to the qubit state. A conditional gate component 806 conditionally gates the control pulse based on the measurement outcome result.

The qubit state decision component can perform the linear filtering operation by multiplying the qubit signal with a value from the analog kernel to obtain a multiplication result, integrates the multiplication result into an integration result, and compares the integration result to the threshold value to determine the measurement outcome result. The qubit state decision component can comprise a microwave mixer component coupled to a capacitor integrator, and an analog comparator component that compares the result to the threshold value to determine the measurement outcome result.

The control pulse can comprise a qubit reset pulse. The qubit state decision component is located in a cryostat proximate a qubit that provides the qubit signal.

The system can further comprise a feedback path comprising control hardware that updates future pulses in the pulse pipeline. The control hardware can be implemented in a field programmable gate array.

The system can further comprise an additional control pulse corresponding to speculative execution of a branch, and another conditional gate component 806 that gates the additional control pulse. The conditional gate component 806 comprises an analog switch 114 coupled to an analog-controlled phase shifter 442.

Figure 9:
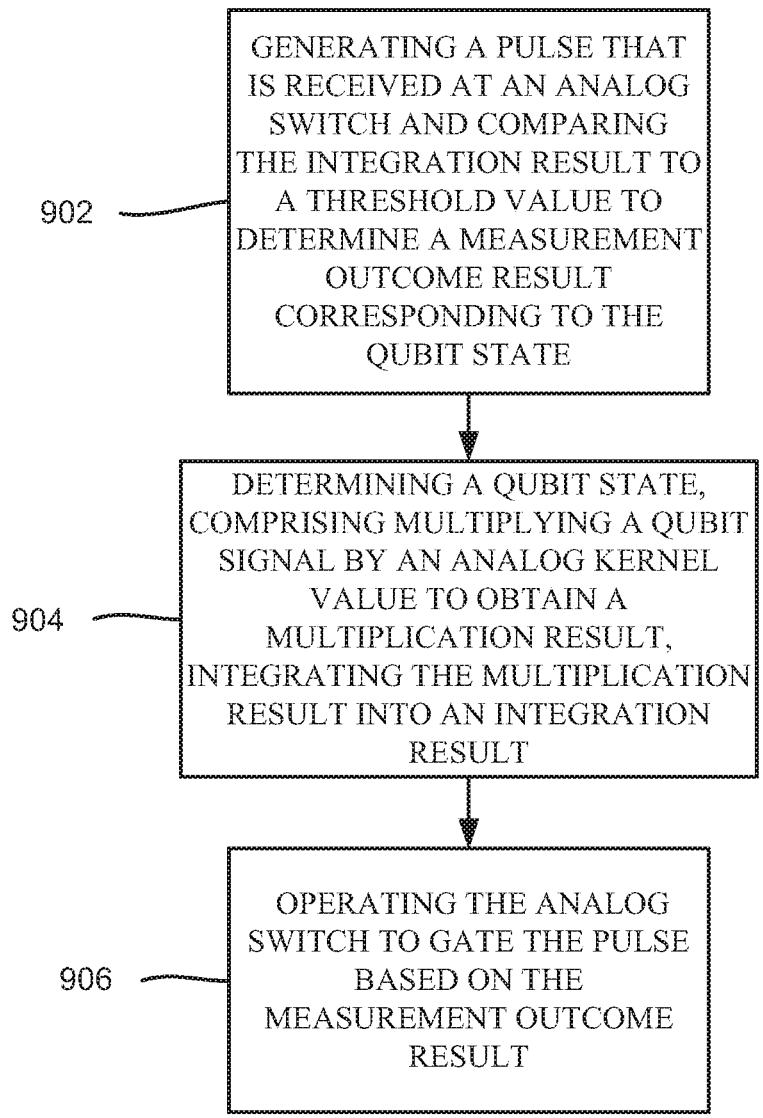
FIG. 9 illustrates a flow diagram of an example, non-limiting method in accordance with one or more embodiments described herein.

As represented in FIG. 9, a method implemented at least in part on a quantum computer, can comprise generating a pulse that is received at an analog switch (operation 902). Operation 904 represents determining a qubit state, comprising multiplying a qubit signal by an analog kernel value to obtain a multiplication result, integrating the multiplication result into an integration result, and comparing the integration result to a threshold value to determine a measurement outcome result corresponding to the qubit state. Operation 906 represents operating the analog switch to gate the pulse based on the measurement outcome result.

The pulse can comprise a qubit reset pulse, and wherein operating the analog switch to gate the qubit control pulse based on the measurement outcome result can comprise operating the analog switch to blank the qubit reset pulse. Operating the analog switch can comprise sending a microwave pulse to reset the qubit.

A second pulse can be received at a second analog switch, and the method can further comprise operating the second analog switch to gate the second pulse based on the measurement outcome result or based on another measurement outcome result. The analog switch can be a two-way analog switch having one speculative input corresponding to the pulse and another speculative input corresponding to another pulse, and the operating the analog switch to gate the pulse based on the measurement outcome result can comprise outputting the pulse instead of the other pulse.

The method can further comprise receiving the qubit signal at an analog-to-digital converter coupled to digital control hardware.

Figure 10:
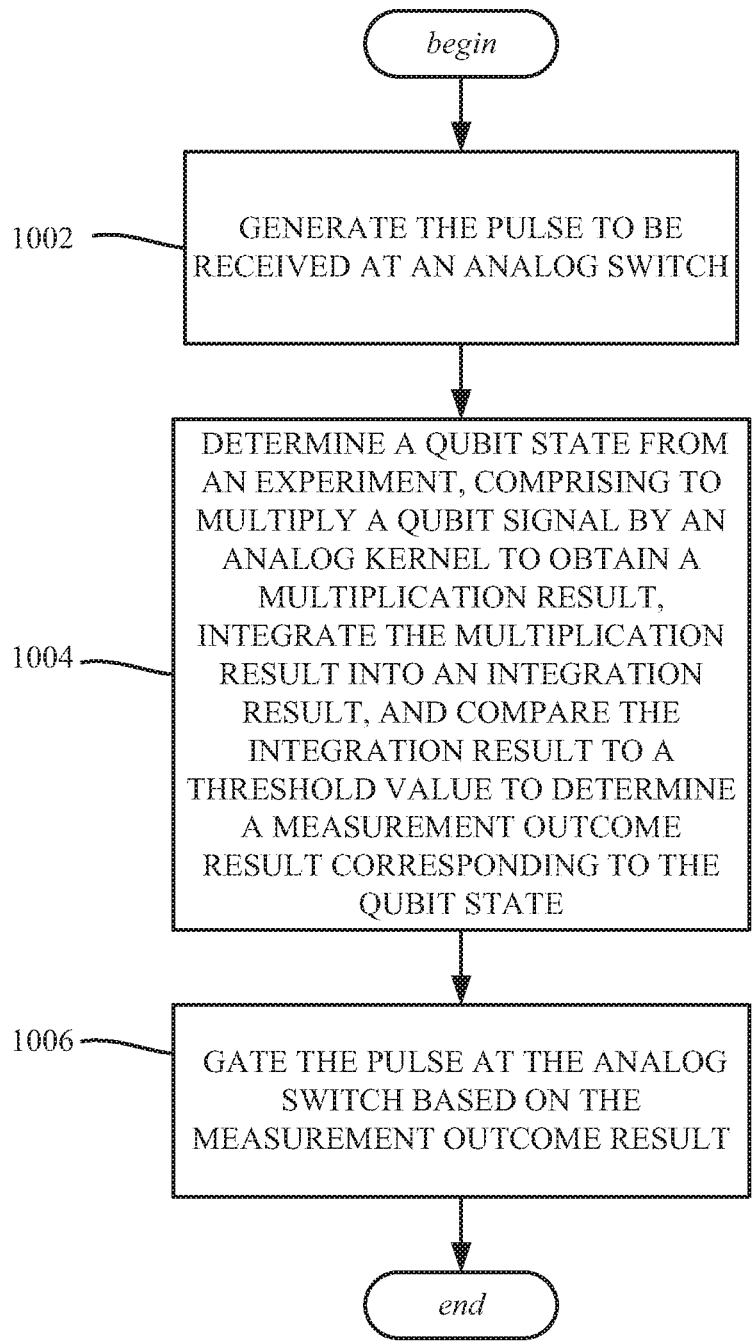
FIG. 10 illustrates a diagram corresponding to operations of an example, machine product, in accordance with one or more embodiments described herein.

Another embodiment, represented in FIG. 10, can comprise a machine product for conditionally gating a pulse based on a measured state of a qubit, and the machine product can comprise program instructions embodied therewith, the program instructions executable by circuitry to generate the pulse to be received at an analog switch (operation 1002). Instructions, represented by operation 1004, can determine a qubit state from an experiment, comprising to multiply a qubit signal by an analog kernel to obtain a multiplication result, integrate the multiplication result into an integration result, and compare the integration result to a threshold value to determine a measurement outcome result corresponding to the qubit state. Other instructions, represented by operation 1006, can gate the pulse at the analog switch based on the measurement outcome result.

The pulse can comprise a qubit reset pulse, and to gate the pulse based on the measurement outcome result can comprise operating the analog switch to blank the qubit reset pulse.

Operating the analog switch can comprise sending a microwave pulse to reset the qubit. A second pulse can be received at a second analog switch, and further instructions can operate the second analog switch to gate the second pulse based on the measurement outcome result. The analog switch can be a two-way analog switch having one speculative input corresponding to the pulse and another speculative input corresponding to another pulse, and to gate the pulse based on the measurement outcome result can comprise outputting the pulse instead of the other pulse.

The processes can be automated in software in such a way that the instrumentation circuits and reconstruction software need not be viewed by a user (unless desired), creating the illusion of a standard debugging environment.

For simplicity of explanation, any computer-implemented or quantum machine methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because the quantum computing machine can be coupled to a more conventional computer, many acts are established from a combination of electrical and mechanical components and circuitry, a human is unable to replicate or perform processing performed by the systems described herein.

Figure 11:
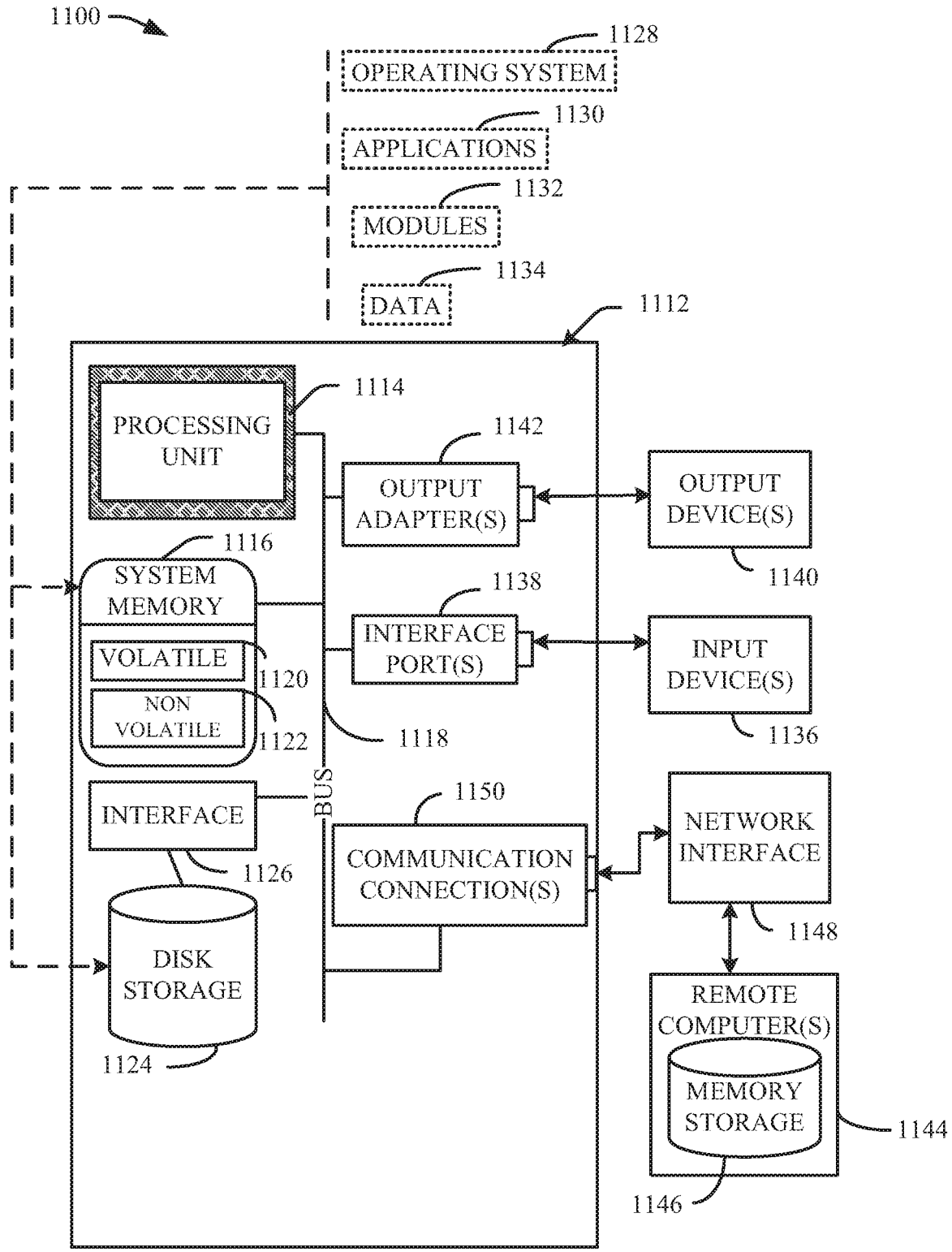
FIG. 11 illustrates a block diagram of an example, non-limiting operating environment in which one or more embodiments described herein can be facilitated.

In order to provide a context for the various aspects of the disclosed subject matter, FIG. 11 as well as the following discussion are intended to provide a general description of a suitable environment in which the various aspects of the disclosed subject matter can be implemented. FIG. 11 illustrates a block diagram of an example, non-limiting operating environment in which one or more embodiments described herein can be facilitated. Repetitive description of like elements employed in other embodiments described herein is omitted for sake of brevity.

With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media. To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112.

System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a pulse generation component that outputs a control pulse with a timing delay;
a qubit state decision component that uses an analog kernel to perform a linear filtering operation on a qubit signal to obtain a result corresponding to a qubit state, and that compares the result to a threshold value to determine a measurement outcome result corresponding to the qubit state; and
a conditional gate component that conditionally gates the control pulse based on the measurement outcome result.

2. The system of claim 1, wherein the qubit state decision component performs the linear filtering operation by multiplying the qubit signal with a value from the analog kernel to obtain a multiplication result, integrates the multiplication result into an integration result, and compares the integration result to the threshold value to determine the measurement outcome result.

3. The system of claim 1, wherein the qubit state decision component comprises a microwave mixer component coupled to a capacitor integrator, and an analog comparator component that compares the result to the threshold value to determine the measurement outcome result.

4. The system of claim 1, wherein the control pulse comprises a qubit reset pulse.

5. The system of claim 1, wherein the qubit state decision component is located in a cryostat proximate a qubit that provides the qubit signal.

6. The system of claim 1, further comprising a feedback path comprising control hardware that updates future pulses.

7. The system of claim 6, wherein the control hardware is implemented in a field programmable gate array.

8. The system of claim 1, further comprising an additional control pulse corresponding to speculative execution of a branch, and another conditional gate component that gates the additional control pulse.

9. The system of claim 1, wherein the conditional gate component comprises an analog switch coupled to an analog-controlled phase shifter.

10. A method, comprising:
generating, by a quantum computer comprising a processor, a pulse that is received at an analog switch;
determining, by the quantum computer, a qubit state, comprising multiplying a qubit signal by an analog kernel value to obtain a multiplication result, integrating the multiplication result into an integration result, and comparing the integration result to a threshold value to determine a measurement outcome result corresponding to the qubit state; and
operating, by the quantum computer, the analog switch to gate the pulse based on the measurement outcome result.

11. The method of claim 10, wherein the pulse comprises a qubit reset pulse, and wherein operating the analog switch to gate a qubit control pulse based on the measurement outcome result comprises operating the analog switch to blank the qubit reset pulse.

12. The method of claim 10, wherein the operating the analog switch comprises sending a microwave pulse to reset the qubit state.

13. The method of claim 10, further comprising:
receiving, by the quantum computer, a second pulse at a second analog switch; and
operating, by the quantum computer, the second analog switch to gate the second pulse based on the measurement outcome result or based on another measurement outcome result.

14. The method of claim 10, wherein the analog switch is a two-way analog switch having one speculative input corresponding to the pulse and another speculative input corresponding to another pulse, and wherein the operating the analog switch to gate the pulse based on the measurement outcome result comprises outputting the pulse instead of the other pulse.

15. The method of claim 10, further comprising:
receiving, by the quantum computer, the qubit signal at an analog-to-digital converter coupled to digital control hardware.

16. A system, comprising:
a qubit control digital to analog converter component that generates a pulse to be received at an analog switch;
an analog mixing integrating comparing component that determines a qubit state from an experiment, comprising to multiply a qubit signal by an analog kernel to obtain a multiplication result, integrate the multiplication result into an integration result, and compare the integration result to a threshold value to determine a measurement outcome result corresponding to the qubit state; and
the analog switch that gates the pulse based on the measurement outcome result.

17. The system of claim 16, wherein the pulse comprises a qubit reset pulse, and wherein the analog switch blanks the qubit reset pulse.

18. The system of claim 16, wherein the analog switch sends a microwave pulse to reset the qubit state.

19. The system of claim 16, further comprising a second pulse that is received at a second analog switch, and the second analog switch gates the second pulse based on the measurement outcome result.

20. The system of claim 16, wherein the analog switch is a two-way analog switch having one speculative input corresponding to the pulse and another speculative input corresponding to another pulse, and wherein the analog switch gates the pulse based on the measurement outcome result by outputting the pulse instead of the other pulse.

21. A method, comprising:
outputting a control pulse with a timing delay;
determining a measurement outcome result corresponding to a state of a qubit, comprising using an analog kernel to perform a linear filtering operation on a qubit signal to obtain a result corresponding to a qubit state, and comparing the result to a threshold value to determine the measurement outcome result corresponding to the qubit state; and conditionally gating the control pulse based on the measurement outcome result.

22. The method of claim 21, further comprising outputting an additional control pulse corresponding to speculative execution of a branch, and conditionally gating the additional control pulse.

23. A system, comprising:

a pulse generation component that generates a pulse to be received at an analog switch;

a qubit state determination component that multiplies a qubit signal by an analog kernel to obtain a multiplication result, integrates the multiplication result into an integration result, and compares the integration result to a threshold value to determine a measurement outcome result corresponding to a qubit state; and a conditional gate component that gates the pulse at the analog switch based on the measurement outcome result.

24. The system of claim 23, wherein the qubit state determination component comprises a microwave mixer component coupled to a capacitor integrator, and an analog comparator component that compares the integration result to the threshold value to determine the measurement outcome result.

25. The system of claim 23, wherein the analog switch is coupled to an analog-controlled phase shifter.

* * * * *